(12) United States Patent
Hayakawa et al.

(10) Patent No.: US 7,477,173 B2
(45) Date of Patent: Jan. 13, 2009

(54) COMBINED AD/DA CONVERTING APPARATUS

(75) Inventors: Yasumasa Hayakawa, Gunma-ken (JP); Akira Yoshida, Ota (JP); Taichiro Kawai, Kiryu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/766,687

(22) Filed: Jun. 21, 2007

(65) Prior Publication Data

US 2007/0296622 A1 Dec. 27, 2007

(30) Foreign Application Priority Data

Jun. 21, 2006 (JP) ............................ 2006-171793

(51) Int. Cl.
*H03M 1/66* (2006.01)
(52) U.S. Cl. ........................ 341/108; 341/144; 341/155
(58) Field of Classification Search ................. 341/108, 341/144, 155
See application file for complete search history.

(56) References Cited

U.S. PATENT DOCUMENTS 5,252,976 A * 10/1993 Miho et al. ................. 341/163
6,597,300 B2 * 7/2003 Mori ........................... 341/144
2005/0237234 A1 * 10/2005 Kobayashi et al. ........... 341/155
2006/0125676 A1 * 6/2006 Kobayashi ................... 341/155

FOREIGN PATENT DOCUMENTS

| JP | 2002-025078 | 1/2002 |
|---|---|---|
| JP | 2003-224473 | 8/2003 |

* cited by examiner

*Primary Examiner*—Jean B Jeanglaude
(74) *Attorney, Agent, or Firm*—SoCal IP Law Group LLP; Steven C. Sereboff; John E. Gunther (57) ABSTRACT

A combined AD/DA converting apparatus includes an input signal selection circuit configured to select one analog signal out of a plurality of analog input signals based on an input selection signal; an input sample hold circuit configured to sample and hold the analog input signal; a DA converter configured to convert a digital signal into an analog signal; a comparator circuit configured to output a comparison signal that indicates a size relation between the analog input signal and the analog signal; a sequential comparison register configured to define sequentially each place of a digital signal stored in the register based on the comparison signal; and a selection circuit configured to output the digital signal to the DA converter when the conversion selection signal indicates AD conversion, and to output the digital input signal to the DA converter when the conversion selection signal indicates DA conversion.

6 Claims, 5 Drawing Sheets

COMBINED AD/DA CONVERTING APPARATUS

CROSS-REFERENCE TO RELATED APPLICATION

This application claims the benefit of priority to Japanese Patent Application No. 2006-171793, filed Jun. 21, 2006, of which full contents are incorporated herein by reference.

BACKGROUND OF THE INVENTION

1. Field of the Invention

The present invention relates to a combined AD/DA converting apparatus.

2. Description of the Related Art

An optical disc device carries out a servo process of focusing, tracking, etc., usually through digital processing (e.g., see Japanese Patent Application Laid-Open Publication No. 2002-25078). Carrying out a servo process through digital processing requires an A/D converter that converts an analog signal, such as an FE (Focusing Error) signal and a TE (Tracking Error) signal generated based on an output signal from a pickup, into a digital signal. The servo process through digital processing also requires a DA converter that converts a digital signal resulting from the servo process into an analog signal used for controlling an optical pickup, etc.

Figure 4:
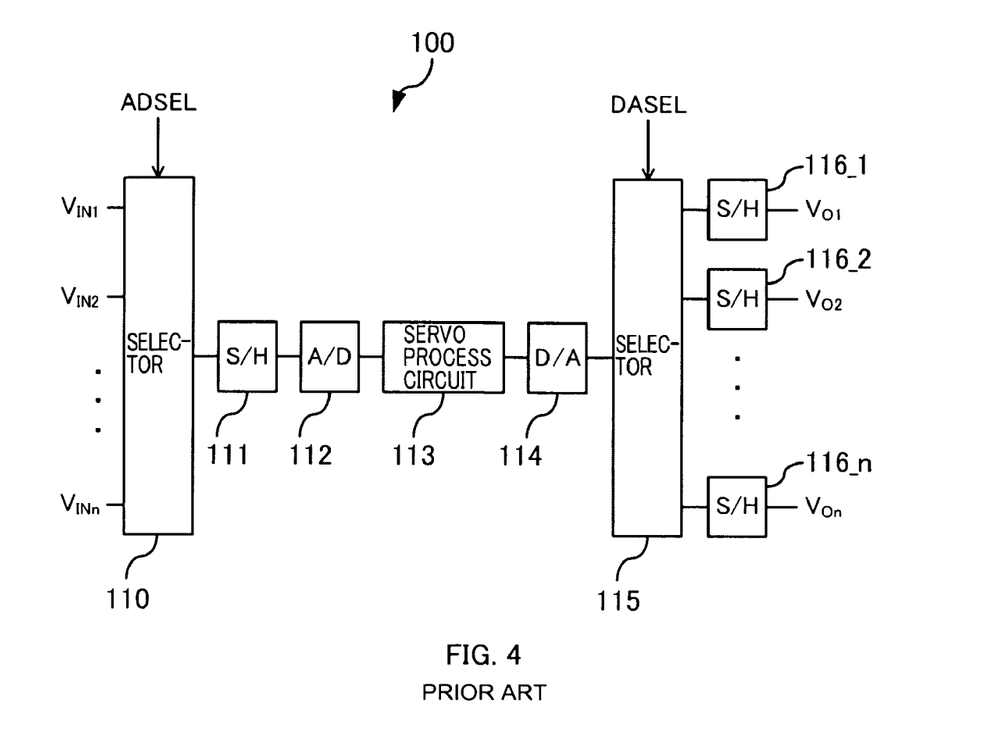
FIG. 4 is a diagram of a general configurative example of a servo processor having an AD converter and a DA converter.

FIG. 4 is a diagram of a general configurative example of a servo processor having an AD converter and a DA converter. The servo processor 100 includes a selector 110, sample hold circuit 111, the AD converter 112, a servo process circuit 113, the D/A converter 114, a selector 115, and sample hold circuits 116_1 to 116_$n$.

A plurality of analog signals ($V_{IN1}$ to $V_{INn}$), such as FE signals and TE signals, are input to the selector 110, which then outputs one analog signal corresponding to a selection signal ADSEL. The signal output from the selector 110 is input to the AD converter 112 via the sample hold circuit 111. The servo process circuit 113 outputs a digital signal for carrying out a focusing process, tracking process, etc., based on a digital signal output from the AD converter 112. The digital signal output from the servo process circuit 113 is converted by the DA converter 114 into an analog signal, which is input to the selector 115. The analog signal input to the selector 115 is output to any one of the sample hold circuits 116_1 to 116_$n$ based on a selection signal DASEL. Then, the sample hold circuits 116_1 to 116_$n$ output analog signals ($V_{O1}$ to $V_{On}$), which are used for carrying out the focusing process, tracking process, etc.

Figure 5:
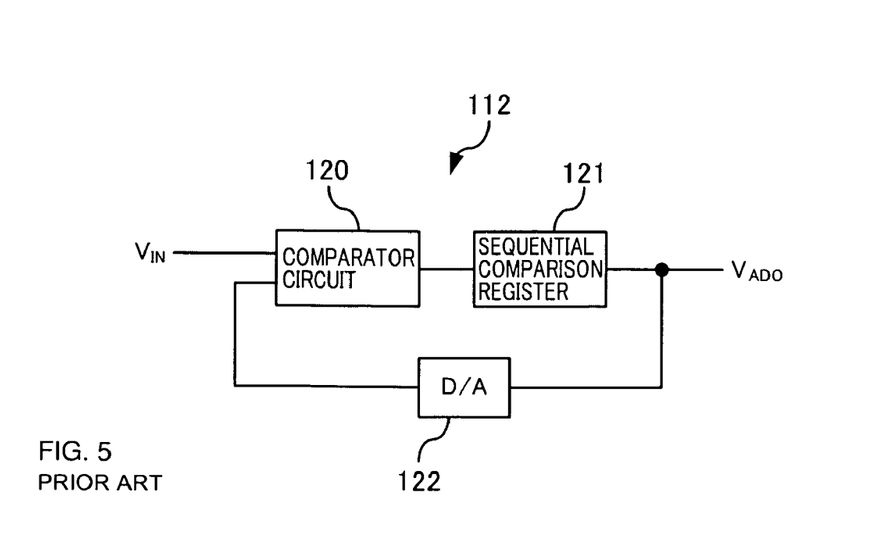
FIG. 5 is a diagram of a general configurative example of the AD converter provided as a sequential comparison type AD converter.

A sequential comparison type AD converter is used as the AD converter 112 in many cases. FIG. 5 is a diagram of a general configurative example of the AD converter provided as a sequential comparison type AD converter. The AD converter 112 includes a comparator circuit 120, a sequential comparison register 121, and a DA converter 122. In the AD converter 112, the comparator circuit 120 makes a size comparison of an input analog signal $V_{IN}$ and an analog signal resulting from DA conversion by the DA converter 122 of a digital signal stored in the sequential comparison register 121. Through the size comparison, the value of the digital signal stored in the sequential comparison register 121 is defined bit by bit sequentially from the most significant bit. After the definition of the least significant bit is over, a digital signal $V_{ADO}$ remains stored in the sequential comparison register 121, and this digital signal $V_{ADO}$ is a signal resulting from AD conversion of the analog signal $V_{IN}$.

The servo processor 100 carries out AD conversion of the plurality of analog signals ($V_{IN1}$ to $V_{INn}$), and also carries out DA conversion to obtain the plurality of analog signals ($V_{O1}$ to $V_{On}$). The servo processor 100, therefore, executes an AD conversion process and a DA conversion process in parallel, as shown in a timing chart of FIG. 6. In the case shown in FIG. 6, the selection signal ADSEL for selecting an analog signal $V_{IN1}$ is output in timing at which a counter CNT, which counts up according to a clock CLK, is "0". In timing at which the counter CNT is "4", a reset signal ADRES turns to H level, a digital signal in the sequential comparison register 121 is set to an initial value, and the sample hold circuit 111 starts sampling. In timing at which the counter CNT is "5", the sample hold circuit 111 holds the value of the analog signal $V_{IN1}$. Then, in timing at which counter CNT is "6", a defining process on the digital signal stored in the sequential comparison register 121 starts to define the value of the digital signal from the most significant bit (MSB) to the least significant bit (LSB) in sequence. When the definition of the least significant bit (LSB) is over, the digital signal $V_{ADO}$ resulting from AD conversion of the analog signal $V_{IN1}$ is obtained.

Figure 6:
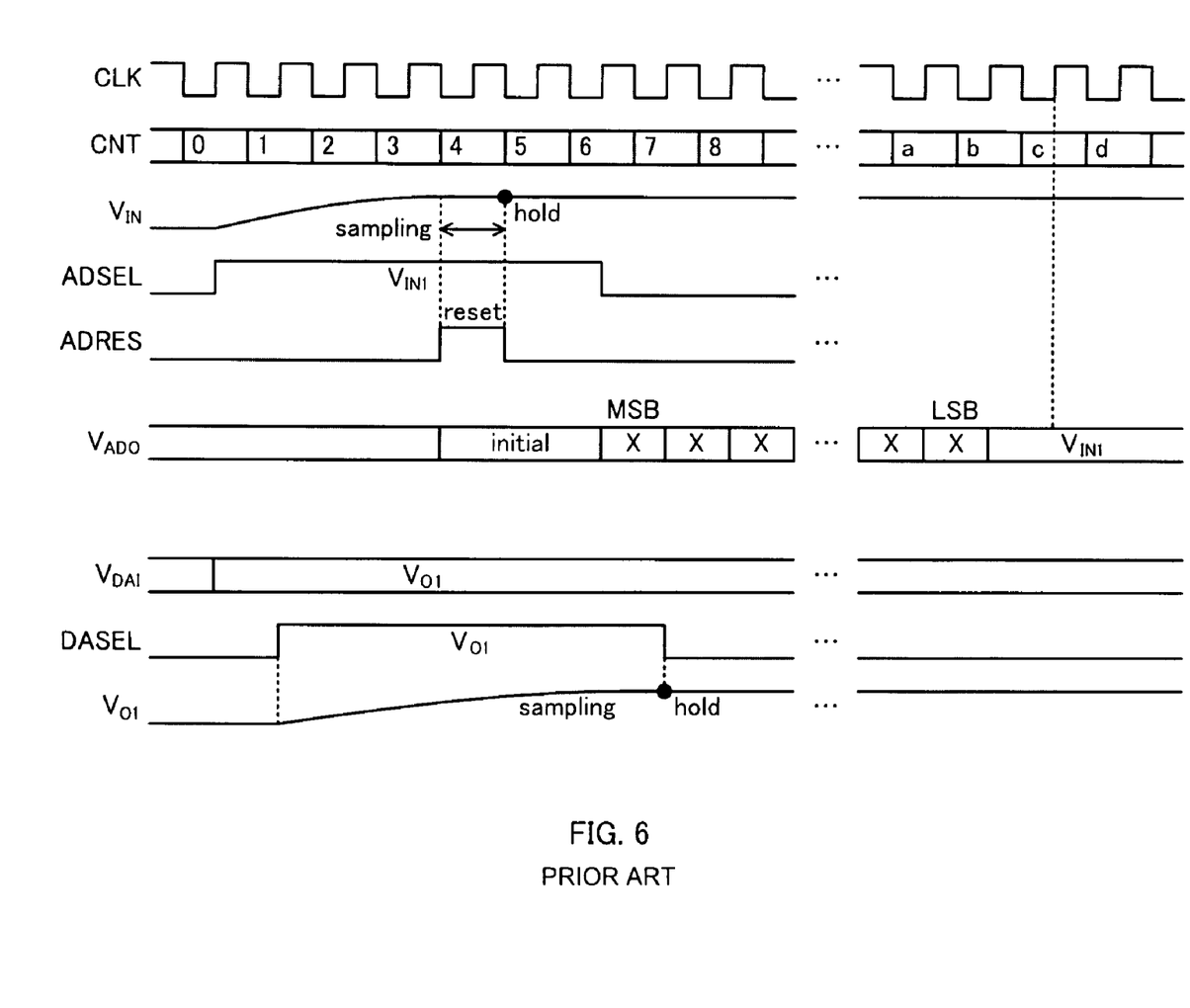
FIG. 6 is a timing chart of an operation example in a case where AD conversion and DA conversion are carried out in parallel.

In parallel with the above AD conversion, in timing at which the counter CNT is "0", the servo process circuit 113 starts outputting a digital signal that is to be output as an analog signal $V_{O1}$. In timing at which the counter CNT is "1", the selection signal DASEL for outputting the analog signal $V_{O1}$ is output, and a sample hold circuit 116_1 starts sampling. Then, the sample hold circuit 116_1 holds the analog signal $V_{O1}$ in timing at which the counter CNT is "7". As a result, the analog signal $V_{O1}$ is obtained as a signal resulting from DA conversion of the digital signal output from the servo process circuit 113.

When a sequential comparison type converter is employed as the AD converter 112, the servo processor 100 needs two DA converters 114 and 122. This increases the size of a circuit composing the servo processor 100. A method to deal with this problem has been known. According to the method, a circuit size increase is suppressed by causing a DA converter incorporated in a sequential comparison type AD converter to serve also as a DA converter for DA conversion when both AD conversion and DA conversion have to be carried out (e.g., see Japanese Patent Application Laid-Open Publication No. 2003-224473).

As described above, the servo processor 100 carries out AD conversion of the plurality of analog signals ($V_{IN1}$ to $V_{INn}$), and also carries out DA conversion to obtain the plurality of analog signals ($V_{O1}$ to $V_{On}$). Because of this, when the servo processor 100 carries out AD conversion and DA conversion using such a combined AD/DA converting apparatus as disclosed in Japanese Patent Application Laid-Open Publication No. 2003-224473, the servo processor 100 cannot carry out AD conversion and DA conversion in parallel. As a result, for example, the servo processor 100 carries out AD conversion and DA conversion alternately again and again, which increases a processing time necessary for AD conversion and DA conversion, leading to a lower processing speed in executing such a process as focusing and tracking.

SUMMARY OF THE INVENTION

The present invention was conceived in view of the above problem, and it is therefore the object of the present invention is to provide a combined AD/DA converting apparatus that can reduce a processing time.

In order to solve the above problems, according to a major aspect of the present invention there is provided a combined AD/DA converting apparatus carrying out AD conversion of an analog input signal to output a converted digital signal or carrying out DA conversion of a digital input signal to output a converted analog signal based on a conversion selection signal for selecting AD conversion or DA conversion, the converting apparatus comprising: an input signal selection circuit configured to select one analog signal out of a plurality of analog input signals to be output based on an input selection signal; an input sample hold circuit configured to sample and hold the analog input signal output from the input signal selection circuit;

a DA converter configured to convert a digital signal into an analog signal to be output; a comparator circuit configured to output a comparison signal that indicates a size relation between the analog input signal output from the input sample hold circuit and the analog signal output from the DA converter; a sequential comparison register configured to define sequentially each place of a digital signal stored in the register based on the comparison signal output from the comparison circuit; a selection circuit configured to receive the digital signal stored in the sequential comparison register, the digital input signal, and the conversion selection signal, the selection circuit being configured to output the digital signal stored in the sequential comparison register to the DA converter when the conversion selection signal indicates AD conversion, and to output the digital input signal to the DA converter when the conversion selection signal indicates DA conversion; and a controlling unit configured to output the input selection signal when the conversion selection signal indicates DA conversion.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

<Circuit Configuration>

Figure 1:
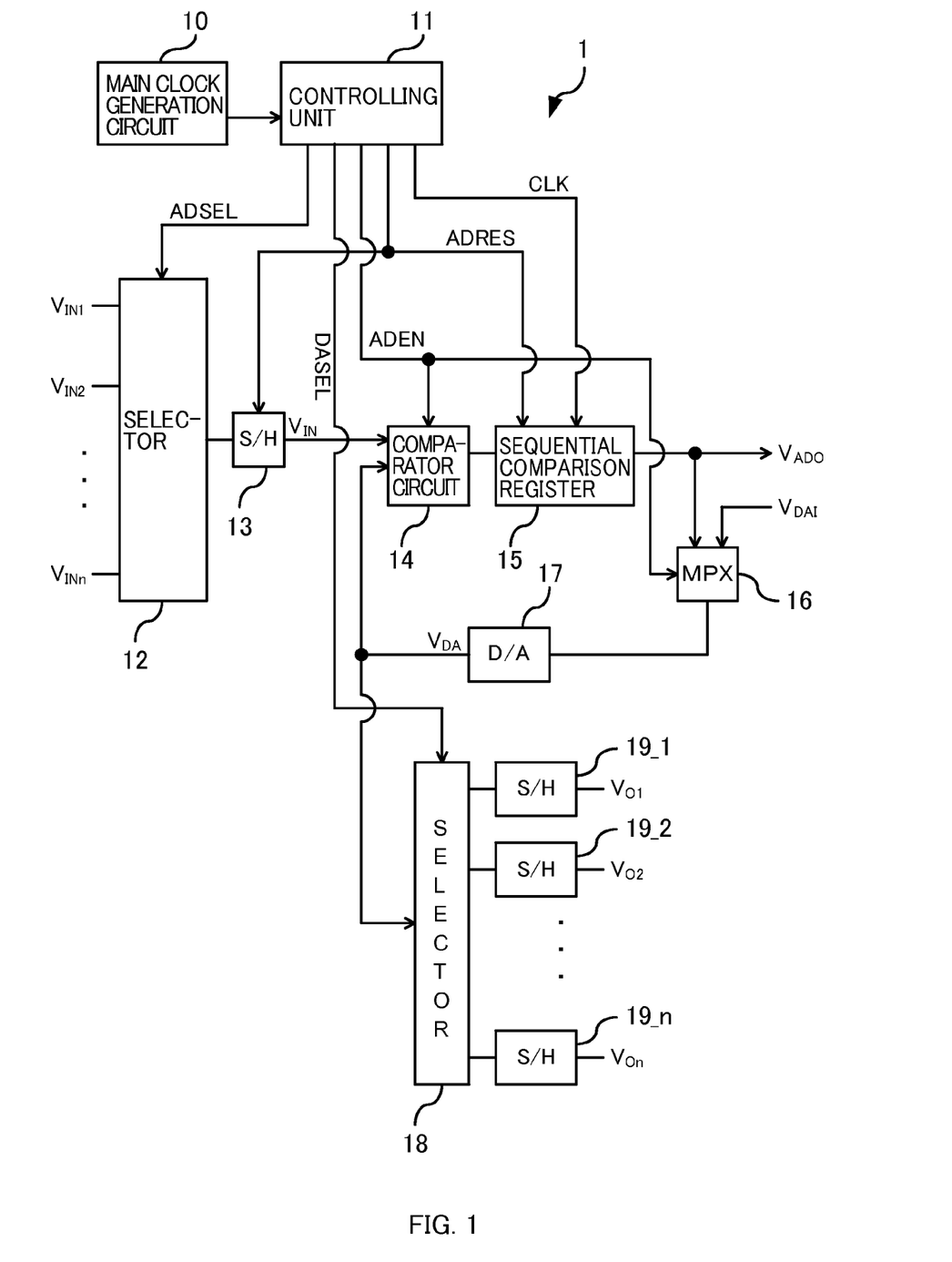
FIG. 1 is a diagram of the configuration of a combined AD/DA converting apparatus according to one embodiment of the present invention.

FIG. 1 is a diagram of the configuration of a combined AD/DA converting apparatus according to one embodiment of the present invention. The combined AD/DA converting apparatus 1 combines a function of carrying out AD conversion of analog signals ($V_{IN1}$ to $V_{INn}$), such as an FE signal and a TE signal, to output a digital signal $V_{ADO}$, and a function of carrying out DA conversion of a digital signal $V_{ADI}$, which is used for carrying out a focusing process, tracking process, etc., to output analog signals ($V_{O1}$ to $V_{On}$).

The combined AD/DA converting apparatus 1 includes a main clock generation circuit 10, a controlling unit 11, a selector 12, a sample hold circuit 13, a comparator circuit 14, a sequential comparison register 15, a multiplexer (MPX) 16, a DA converter 17, a selector 18, and a plurality of sample hold circuits 19_1 to 19_n.

The main clock generation circuit 10 is the circuit that generates a main clock of a given frequency. The controlling unit 11 outputs a clock CLK, a conversion selection signal ADEN, a reset signal ADRES, an input selection signal ADSEL, and an output selection signal DASEL, the clock and signals being needed for operation of the combined AD/DA converting apparatus 1, based on the main clock output from the main clock generation circuit 10.

The clock CLK is the signal obtained by multiplying the frequency of the main clock through, for example, a frequency multiplier. The conversion selection signal ADEN is the signal for making a selection between execution of AD conversion and execution of DA conversion in the combined AD/DA converting apparatus 1. According to the present embodiment, AD conversion is carried out when the conversion selection signal ADEN is at H level, and DA conversion is carried out when the conversion selection signal ADEN is at L level. The reset signal ADRES is the signal for initializing a digital signal stored in the sequential comparison register 15. According to the present embodiment, the sequential comparison register 15 is reset when the reset signal ADRES is at H level. The signal ADRES serves also as a control signal for sampling analog signals ($V_{IN1}$ to $V_{INn}$). The input selection signal ADSEL is the signal for selecting one analog signal to be subjected to AD conversion out of a plurality of analog signals ($V_{IN1}$ to $V_{INn}$). The output selection signal DASEL is the signal for selecting the output destination of an analog signal resulting from DA conversion.

The controlling unit 11 can be configured using the frequency multiplier that generates the clock CLK, a counter circuit that counts the clock CLK, and a logic circuit that outputs each signal ADEN, ADRES, ADSEL, and DASEL according to output from the counter circuit. The controlling unit 11 may be input to operation by causing a processor to execute a program stored in a memory.

The selector 12 (input signal selection circuit) is the circuit that selects one analog signal corresponding to the input selection signal ADSEL out of a plurality of input analog signals (analog input signals: $V_{IN1}$ to $V_{INn}$) to output the selected analog signal. The selector 12 can be configured using, for example, n units of transfer gates.

The sample hold circuit 13 (input sample hold circuit) is the circuit that samples and holds an analog signal output from the selector 12. The sample hold circuit 13 receives the ADRES signal, sampling the analog signal output from the selector 12 when the ADRES signal is at H level.

The comparator circuit 14 is the circuit that makes a size comparison of an analog signal $V_{IN}$ output from the sample hold circuit 13 and an analog signal $V_{DA}$ output from the DA converter 17 to output a comparison signal indicating a result of the size comparison. The comparator circuit 14 receives the conversion selection signal ADEN, which fixes a comparison signal output from the comparator circuit 14 to a given level when the conversion selection signal ADEN indicates DA conversion.

Figure 2:
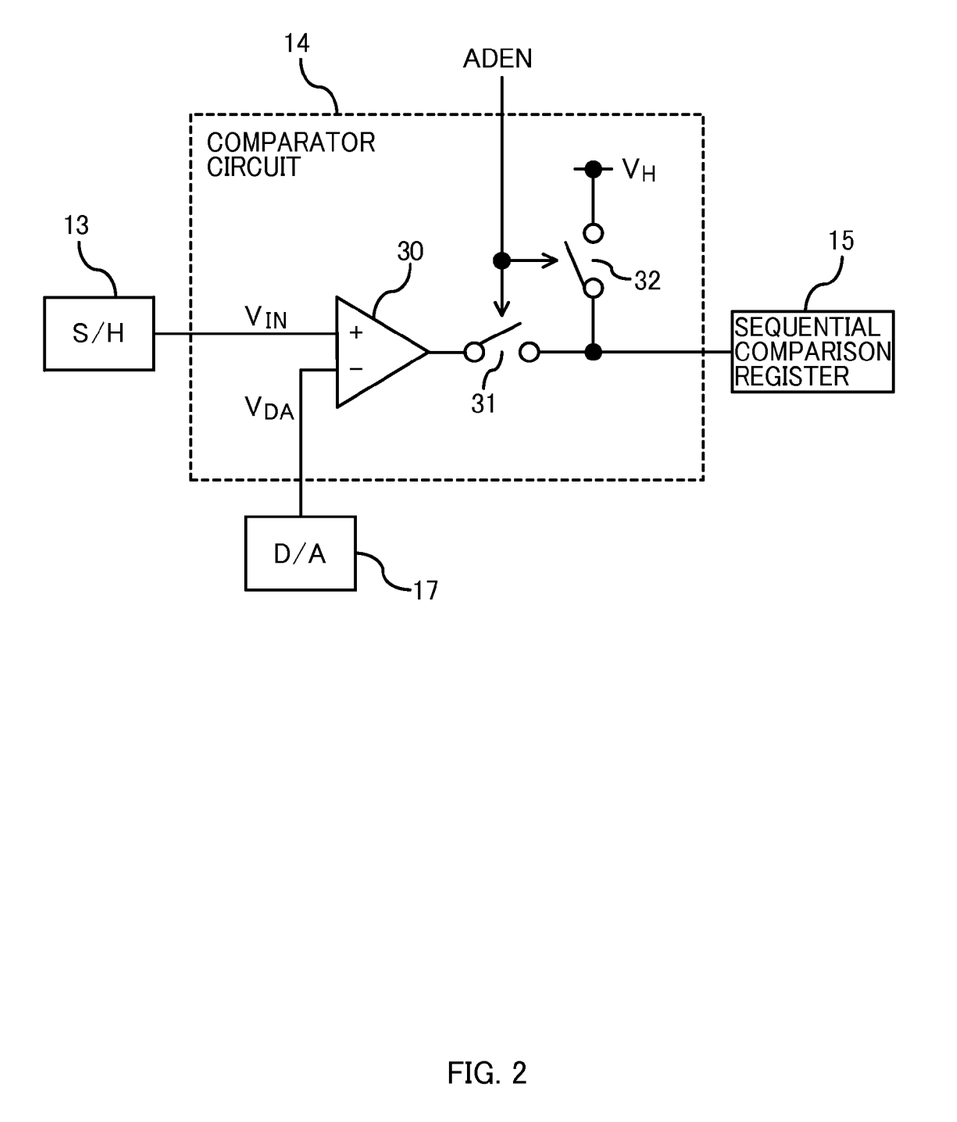
FIG. 2 is a diagram of a configurative example of a comparison circuit.

FIG. 2 is a diagram of a configurative example of the comparison circuit 14. The comparison circuit 14 has a comparator 30, and switch circuits 31 and 32. To the positive input terminal of the comparator 30, the analog signal $V_{IN}$ output from the sample hold circuit 13 is input. To the negative input terminal of the comparator 30, the analog signal $V_{DA}$ output from the DA converter 17 is input. According to the present embodiment, therefore, a comparison signal output from the comparator 30 is at H level when the analog signal $V_{IN}$ is larger than the analog signal $V_{DA}$, and is at L level when the analog signal $V_{IN}$ is smaller than the analog signal $V_{DA}$. The switch circuit 31 has one end connected to the output terminal of the comparator 30, and the other end connected to the sequential comparison register 15. According to the present embodiment, the switch circuit 31 is ON when the conversion selection signal ADEN is at H level, and is OFF when the conversion selection signal ADEN is at L level. The switch circuit 32 has one end to which a voltage $V_H$ indicating H level is applied, and the other end connected to the sequential comparison register 15. According to the present embodiment, the switch circuit 32 is OFF when the conversion selection signal ADEN is at H level, and is ON when the conversion selection signal ADEN is at L level. In other words, when the conversion selection signal ADEN indicates AD conversion, the switch circuit 31 is ON while the switch circuit 32 is OFF, at which a comparison signal resulting from the analog signals $V_{IN}$ and $V_{DA}$, which comparison signal is output from the comparator 30, is input to the sequential comparison register 15. When the conversion selection signal ADEN indicates DA conversion, on the other hand, the switch circuit 31 is OFF while the switch circuit 32 is ON, at which a signal at H level is input to the sequential comparison register 15 regardless of the comparison signal resulting from the analog signals $V_{IN}$ and $V_{DA}$, which comparison signal is output from the comparator 30. The signal input to the sequential comparison register 15 when the conversion selection signal ADEN indicates DA conversion is not limited to a signal at H level, but a signal at a given level is applicable. For example, a signal at the ground level may be input to the sequential comparison register 15.

The sequential comparison register 15 is, for example, the register that stores a digital signal consisting of eight bits. The digital signal stored in the sequential comparison register 15 is reset to set all bits of the digital signal to "0" (initial value), for example, when the reset signal ADRES is at H level. Then, based on a comparison signal output from the comparator circuit 14, every bit of the digital signal is defined as "0" or "1" sequentially from the most significant bit (MSB).

Specifically, at first, only the most significant bit (MSB) of the digital signal in the sequential comparison register 15 is set to "1". This digital signal is then subjected to DA conversion at the DA converter 17, which outputs the analog signal $V_{DA}$. At this time, if the comparison signal output from the comparator circuit 14 is at H level, that is, if the analog signal $V_{IN}$ is larger than the analog signal $V_{DA}$, the most significant bit (MSB) is defined as "1". Conversely, if the comparison signal output from the comparator circuit 14 is at L level, that is, if the analog signal $V_{IN}$ is smaller than the analog signal $V_{DA}$, the most significant bit (MSB) is defined as "0". The same process as described above is repeated until the least significant bit (LSB) is defined. Hence the digital signal stored in the sequential comparison register 15 is turned into a signal resulting from AD conversion of the analog signal $V_{IN}$.

The initial value of the digital signal stored in the sequential comparison register 15 is not limited to the signal consisting entirely of "0" bits. For example, the signal may consist entirely of "1" bits, or may have the most significant bit of "1" and the rest of bits of "0".

The multiplexer 16 (selection circuit) selects and outputs either of a digital signal $V_{ADO}$ output from the sequential comparison register 15 or a digital signal $V_{DAI}$ that is an input signal for DA conversion based on the conversion selection signal ADEN. Specifically, the multiplexer 16 outputs the digital signal $V_{ADO}$ when the conversion selection signal ADEN indicates AD conversion, and outputs the digital signal $V_{DAI}$ when the conversion selection signal ADEN indicates DA conversion.

The DA converter 17 carries out DA conversion of a digital signal output from the multiplexer 16 to output an analog signal $V_{DA}$.

The selector 18 (output signal selection circuit) outputs the analog signal $V_{DA}$ from the DA converter 17 to any one of the plurality of sample hold circuits 19_1 to 19_$n$ based on the output selection signal DASEL. The selector 18 can be configured using, for example, n units of transfer gates.

The sample hold circuits 19_1 to 19_$n$ (output sample hold circuits) are the circuits that sample and hold analog signals output from the selector 18.

<Description of Operation>

Figure 3:
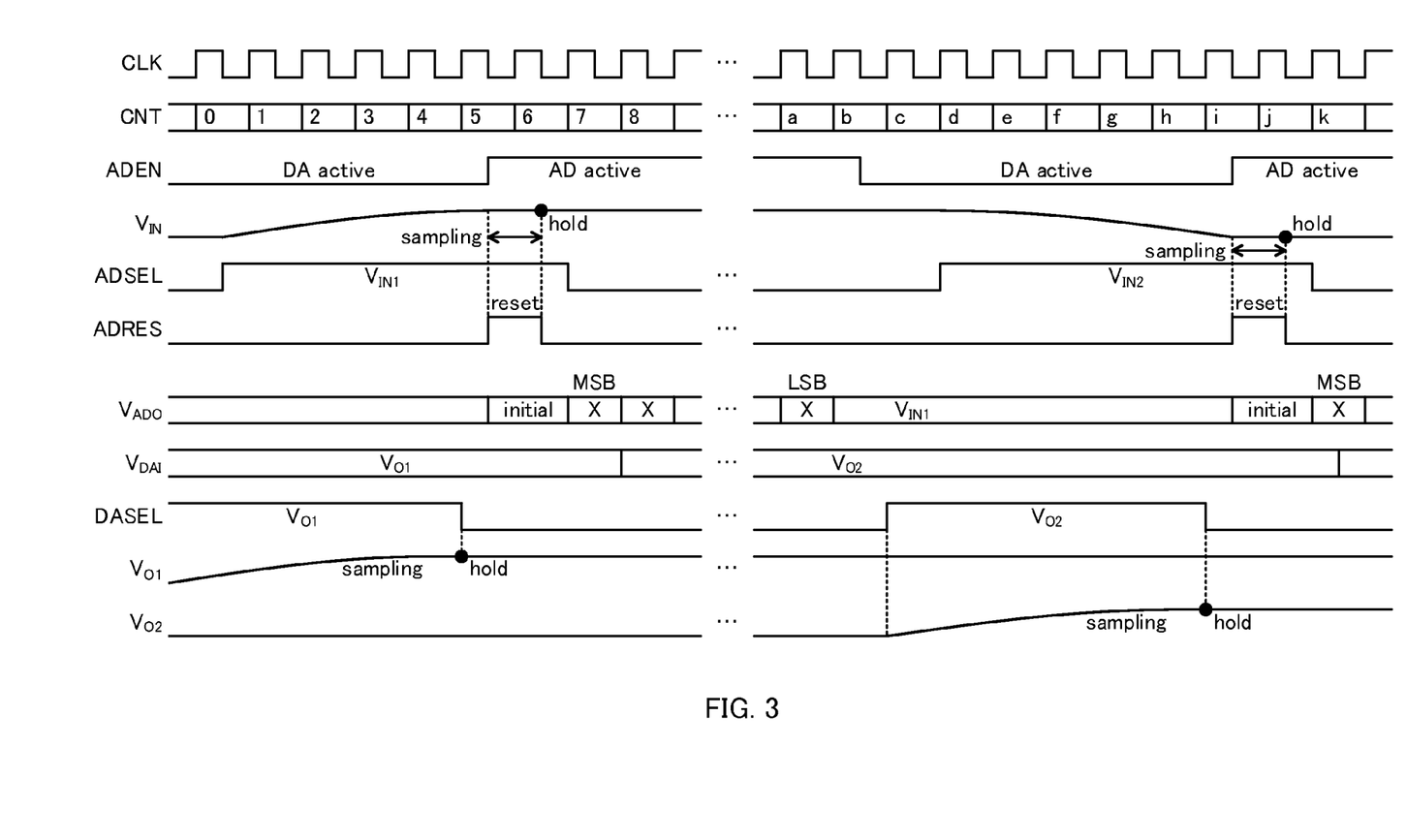
FIG. 3 is a timing chart of an operation example in AD/DA conversion executed by the combined AD/DA converting apparatus.

Operation for carrying out AD conversion and DA conversion will be described. FIG. 3 is a timing chart of an operation example in AD/DA conversion executed by the combined AD/DA converting apparatus 1. In the initial condition, the conversion selection signal ADEN indicates DA conversion (DA active), the input selection signal ADSEL indicates a state of no selection from the analog signals ($V_{IN1}$ to $V_{INn}$), and the output selection signal DASEL indicates a state of output of the analog signal $V_{DA}$ to the sample hold circuit 19_1. In this condition, the multiplexer 16 selects and outputs the digital signal $V_{DAI}$, and the analog signal $V_{DA}$ output from the DA converter 17 is input to the sample hold circuit 19_1 via the selector 18, which sample hold circuit 19_1 carries out sampling. Then, in timing at which the counter CNT is "5", the sample hold circuit 19_1 holds the analog signal $V_{DA}$, and outputs the signal as the analog signal $V_{O1}$ resulting from DA conversion of the digital signal $V_{DAI}$.

In parallel with the sampling operation by the sample hold circuit 19_1, the input selection signal ADSEL becomes a state of selection of the analog signal $V_{IN1}$ in timing at which the counter CNT is "0", which causes the selector 12 to output the analog signal $V_{IN1}$. Afterward, in timing at which the counter CNT is "5", the conversion selection signal ADEN becomes a state of indication of AD conversion (AD active), which causes the reset signal ADRES to turn to H level. When the reset signal ADRES turns to H level, the digital signal $V_{ADO}$ stored in the sequential comparison register 15 is reset to the initial value, at which the sample hold circuit 13 starts sampling. Then, in timing at which the counter CNT is "6", the reset signal ADRES turns to L level, at which the sample hold circuit 13 holds the analog signal $V_{IN1}$, outputting the signal as the input signal $V_{IN}$ to the comparator circuit 14. Subsequently, in timing at which the counter CNT is "7", the defining process on the digital signal $V_{ADO}$ stored in the sequential comparison register 15 starts to define each bit of the digital signal $V_{ADO}$ sequentially from the most significant bit (MSB). When the least significant bit (LSB) of the digital signal $V_{ADO}$ has been defined in timing at which the counter CNT is "a", the digital signal $V_{ADO}$ output from the sequential comparison register 15 is turned into a signal resulting from DA conversion of the analog signal $V_{IN1}$.

In timing at which the counter CNT is "8", the digital signal $V_{DAI}$ that is an input signal for the next DA conversion is input to the multiplexer 16. Then, the conversion selection signal ADEN becomes a state of indication of DA conversion (DA active) in timing at which the counter CNT is "b". This causes the multiplexer 16 to select and output the digital signal $V_{DAI}$. Subsequently, the output selection signal DASEL changes into a state of output of the analog signal $V_{DA}$ to a sample hold circuit 19_2 in timing at which the counter CNT is "c", which causes the sample hold circuit 19_2 to start sampling. Then, in timing at which the counter CNT is "i", the sample hold circuit 19_2 holds the analog signal $V_{DA}$, outputting the signal as an analog signal $V_{O2}$ resulting from DA conversion of the digital signal $V_{DAI}$.

When the multiplexer 16 starts outputting the digital signal $V_{DAI}$ in timing at which the counter CNT is "b", the analog signal $V_{DA}$ output from the DA converter 17 changes. When the conversion selection signal ADEN is in the state of indication of DA conversion (DA active), however, output from the comparator circuit 14 is fixed to a given level (to H level in the present embodiment), and sequential comparison data has been subjected to the defining process. For this reason, the digital signal $V_{ADO}$ output from the sequential comparison register 15 does not change.

As described above, the combined AD/DA converting apparatus 1 repeats AD conversion and DA conversion alternately to carry out AD conversion of the plurality of analog signals ($V_{IN1}$ to $V_{INn}$) and DA conversion of the plurality of digital signals $V_{DAI}$.

According to the above description of the combined AD/DA converting apparatus 1 of the present embodiment, the combined AD/DA converting apparatus 1 selects the next analog signal to be subjected to AD conversion while DA conversion is in progress. This allows quick sampling and holding of the analog signal upon starting AD conversion following the completion of DA conversion. A total time required for AD conversion and DA conversion, therefore, can be reduced, compared to a case where AD conversion and DA conversion are executed simply in series. Applying such a combined AD/DA converting apparatus 1 to a servo processor, etc., requiring both an AD converter and a DA converter eliminates a need of providing the servo processor with a dedicated DA converter for DA conversion, thus suppressing an increase in a circuit size.

According to the present embodiment, an analog signal is sampled and held after the conversion selection signal ADEN has changed into the state of indication of AD conversion (AD active). Sampling and holding of the analog signal, however, may be carried out while DA conversion is in progress. Likewise, the initialization of the digital signal $V_{ADO}$ stored in the sequential comparison register 15 may be carried out while DA conversion is in progress. Holding and sampling the analog signal and initializing the sequential comparison register 15 during DA conversion enables further reduction of a processing time.

According to the combined AD/DA converting apparatus 1, a comparison signal output from the comparator circuit 14 is fixed to a given level and sequential comparison data has been subjected to the defining process while DA conversion is in progress. Because of this, when the analog signal $V_{DA}$ output from the DA converter 17 changes, the digital signal $V_{ADO}$ that is the result of AD conversion carried out right before the DA conversion can be held as it is. No effect, therefore, is given to a servo process circuit, etc., which performs its process using the digital signal $V_{ADO}$, during DA conversion.

According to the combined AD/DA converting apparatus 1, the selector 12 is capable of making a selection from the plurality of analog signals ($V_{IN1}$ to $V_{INn}$), and starts outputting the next analog signal to be subjected to AD conversion according to the input selection signal ADSEL while DA conversion is in progress. Applying the combined AD/DA converting apparatus 1 to a servo processor, etc., requiring AD conversion of a plurality of analog signals, therefore, reduces a total time required for AD conversion and DA conversion.

The combined AD/DA converting apparatus 1 is provided with the sample hold circuits 19_1 to 19_n, which sample and hold the analog signal $V_{DA}$ resulting from DA conversion of the digital signal $V_{DAI}$. In the combined AD/DA converting apparatus 1, the next analog signal to be subjected to AD conversion is selected while the analog signal $V_{DA}$ resulting from DA conversion is sampled at the sample hold circuits 19_1 to 19_n. This allows the effective use of a time required for sampling of the analog signal $V_{DA}$, which leads to a reduction of a total time required for AD conversion and DA conversion.

The selector 18 of the combined AD/DA converting apparatus 1 is capable of selecting the output destination of the analog signal $V_{DA}$. This enables application of the combined AD/DA converting apparatus 1 to a servo processor, etc., which has to output an analog signal resulting from DA conversion to a plurality of control circuits, etc.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. A combined AD/DA converting apparatus carrying out AD conversion of an analog input signal to output a converted digital signal or carrying out DA conversion of a digital input signal to output a converted analog signal based on a conversion selection signal for selecting AD conversion or DA conversion, the converting apparatus comprising:

an input signal selection circuit configured to select one analog signal out of a plurality of analog input signals to be output based on an input selection signal;

an input sample hold circuit configured to sample and hold the analog input signal output from the input signal selection circuit;

a DA converter configured to convert a digital signal into an analog signal to be output;

a comparator circuit configured to output a comparison signal that indicates a size relation between the analog input signal output from the input sample hold circuit and the analog signal output from the DA converter;

a sequential comparison register configured to define sequentially each place of a digital signal stored in the register based on the comparison signal output from the comparison circuit;

a selection circuit configured to receive the digital signal stored in the sequential comparison register, the digital input signal, and the conversion selection signal, the selection circuit being configured to output the digital signal stored in the sequential comparison register to the DA converter when the conversion selection signal indicates AD conversion, and to output the digital input signal to the DA converter when the conversion selection signal indicates DA conversion; and a controlling unit configured to output the input selection signal when the conversion selection signal indicates DA conversion.

2. The combined AD/DA converting apparatus of claim 1, wherein
the comparator circuit is configured to make the comparison signal at a given level when the conversion selection signal indicates DA conversion.

3. The combined AD/DA converting apparatus of claim 1, further comprising an output sample hold circuit configured to sample and hold the analog signal output from the DA converter when the conversion selection signal indicates DA conversion, wherein
  the controlling unit is configured to output the input selection signal while the output sample hold circuit samples the analog signal.

4. The combined AD/DA converting apparatus of claim 2, further comprising an output sample hold circuit configured to sample and hold the analog signal output from the DA converter when the conversion selection signal indicates DA conversion, wherein
  the controlling unit is configured to output the input selection signal while the output sample hold circuit samples the analog signal.

5. The combined AD/DA converting apparatus of claim 3, wherein
  the output sample hold circuit further includes a plurality of output sample hold circuits, and wherein
  the combined AD/DA converting apparatus further comprises an output signal selection circuit configured to output the analog signal output from the DA converter to any one of the plurality of output sample hold circuits based on an output selection signal.

6. The combined AD/DA converting apparatus of claim 4, wherein the output sample hold circuit further includes a plurality of output sample hold circuits, and wherein
  the combined AD/DA converting apparatus further comprises an output signal selection circuit configured to output the analog signal output from the DA converter to any one of the plurality of output sample hold circuits based on an output selection signal.

* * * * *